United States Patent
Gianchandani et al.

(10) Patent No.: US 10,557,898 B2
(45) Date of Patent: Feb. 11, 2020

(54) FRAME-SUSPENDED MAGNETOELASTIC RESONATORS

(71) Applicant: The Regents of The University of Michigan, Ann Arbor, MI (US)

(72) Inventors: Yogesh Gianchandani, Ann Arbor, MI (US); Jun Tang, Ann Arbor, MI (US); Scott Green, South Lyon, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 218 days.

(21) Appl. No.: 15/113,178

(22) PCT Filed: Jan. 23, 2015

(86) PCT No.: PCT/US2015/012709
§ 371 (c)(1),
(2) Date: Jul. 21, 2016

(87) PCT Pub. No.: WO2015/112875
PCT Pub. Date: Jul. 30, 2015

(65) Prior Publication Data
US 2017/0023652 A1    Jan. 26, 2017

Related U.S. Application Data

(60) Provisional application No. 61/931,300, filed on Jan. 24, 2014.

(51) Int. Cl.
*G01R 33/18* (2006.01)
*G01R 33/038* (2006.01)
*G01L 1/12* (2006.01)

(52) U.S. Cl.
CPC .............. *G01R 33/18* (2013.01); *G01L 1/125* (2013.01); *G01R 33/0385* (2013.01)

(58) Field of Classification Search
CPC ...................................................... G01N 27/72
(Continued)

(56) References Cited

U.S. PATENT DOCUMENTS 4,510,489 A    4/1985  Anderson, III et al.
4,745,401 A    5/1988  Montean
(Continued)

OTHER PUBLICATIONS

Grimes, Craig A., "Magnetoelastic Microsensors for Environmental Monitoring", IEEE, p. 278-281, 2001, 4 pages.
(Continued)

*Primary Examiner* — Jay Patidar
(74) *Attorney, Agent, or Firm* — Reising Ethington P.C.

(57) ABSTRACT

A magnetoelastic tag includes a frame-suspended magnetoelastic resonator that combines a strong resonant response with a relatively small resonator, enabling magnetoelastic sensor use in a variety of inconspicuous applications and/or small packages. The resonator is suspended with respect to a substrate, which reduces, minimizes, or eliminates interaction between the substrate and resonator. Signal strength is thereby enhanced, thereby allowing miniaturization while maintaining a measurable response to the interrogation field. The resonator can have a hexagonal shape and/or be suspended at particular locations about its perimeter to promote signal generation in a direction different from that of the interrogation field. A sensor can include one or more frame-suspended resonators, which can be arranged in an array, stacked, or randomly where a plurality of resonators is employed.

20 Claims, 11 Drawing Sheets

(58) Field of Classification Search
USPC .......................................................... 324/239
See application file for complete search history.

(56) References Cited

U.S. PATENT DOCUMENTS

| | | | |
|---|---|---|---|
| RE32,925 E | 5/1989 | Chen et al. | |
| 4,967,185 A | 10/1990 | Montean | |
| 5,083,112 A | 1/1992 | Piotrowski et al. | |
| 5,142,292 A | 8/1992 | Chang | |
| 5,552,778 A | 9/1996 | Schrott et al. | |
| 6,011,475 A | 1/2000 | Herzer | |
| 6,018,296 A | 1/2000 | Herzer | |
| 6,182,352 B1* | 2/2001 | Deschenes | G08B 13/2408 29/602.1 |
| 6,359,563 B1 | 3/2002 | Herzer | |
| 6,393,921 B1 | 5/2002 | Grimes et al. | |
| 6,426,700 B1* | 7/2002 | Lian | G08B 13/2408 340/572.4 |
| 6,692,672 B1* | 2/2004 | Deschenes | B29C 47/0021 264/151 |
| 6,774,800 B2* | 8/2004 | Friedman | A61B 5/0002 340/572.5 |
| 7,075,440 B2 | 7/2006 | Fabian et al. | |
| 2002/0140558 A1 | 10/2002 | Lian et al. | |
| 2002/0166382 A1* | 11/2002 | Bachas | G01N 33/4905 73/579 |
| 2006/0050765 A1 | 3/2006 | Walker et al. | |
| 2009/0195386 A1* | 8/2009 | Peter | G08B 13/2408 340/572.1 |
| 2010/0326192 A1 | 12/2010 | Petelenz et al. | |
| 2012/0139730 A1* | 6/2012 | Kearney | H01Q 1/2225 340/572.8 |

OTHER PUBLICATIONS

International Search Report corresponding to International application No. PCT/US2015/012709, dated Apr. 24, 2015, 3 pages.
Written Opinion corresponding to International application No. PCT/US2015/012709, dated Apr. 24, 2015, 7 pages.
Friedman, "Photochemical Machining", Metals Handbook, Ninth Edition, vol. 16, 9 pages, 1993.
Copeland et al., "Analysis of a Magnetoelastic Sensor," IEEE Transactions on Magnetics, vol. 30, No. 5, pp. 3399-3402, Sep. 1994.
Kim et al., "Development of a Magnetoelastic Resonant Sensor Using Iron-Rich, Nonzero Magnetostrictive Amorphous Alloys," Metallurgical and Materials Transactions A, vol. 27A, pp. 3203-3213, Oct. 1996.
M. K. Jain, S. Schmidt, and C. A. Grimes, "Magneto-acoustic sensors for measurement of liquid temperature, viscosity and density," Applied Acoustics, vol. 62, pp. 1001-1011, Aug. 2001.
K. F. Zeng, K. G. Ong, C. Mungle, and C. A. Grimes, "Time domain characterization of oscillating sensors: Application of frequency counting to resonance frequency determination," Review of Scientific Instruments, vol. 73, pp. 4375-4380, Dec. 2002.
G. Herzer, "Magnetic materials for electronic article surveillance," Journal of Magnetism and Magnetic Materials, vol. 254, pp. 598-602, Jan. 2003.
A. S. Belyakov, "Magnetoelastic sensors and geophones for vector measurements in geoacoustics," Acoustical Physics, vol. 51, pp. S43-S53, 2005.
J. Benatar, FEM Implementations of Magnetostrictive-Based Applications, MS thesis, Univ. of Maryland, 2005, 175 pages.
F. T. Calkins, A. B. Flatau, and M. J. Dapino, "Overview of magnetostrictive sensor technology," Journal of Intelligent Material Systems and Structures, vol. 18, pp. 1057-1066, Oct. 2007.
E. L. Tan, B. D. Pereles, B. Horton, R. Shao, M. Zourob, and K G. Ong, "Implantable Biosensors for Real-time Strain and Pressure Monitoring," Sensors, vol. 8, pp. 6396-6406, Oct. 2008.
S. R. Green and Y. B. Gianchandani, "Wireless Magnetoelastic Monitoring of Biliary Stents," Journal of Microelectromechanical Systems, vol. 18, pp. 64-78, Feb. 2009.
W. Shen, L. C. Mathison, V. A. Petrenko, and B. A. Chin, "A pulse system for spectrum analysis of magnetoelastic biosensors," Applied Physics Letters, vol. 96, Apr. 19, 2010, 4 pages.
S. R. Green and Y. B. Gianchandani, "Tailored magnetoelastic sensor geometry for advanced functionality in wireless biliary stent monitoring systems," Journal of Micromechanics and Microengineering, vol. 20, pp. 075040-075053, Jul. 2010.
C. A. Grimes, S. C. Roy, S. J. Rani, and Q. Y. Cai, "Theory, Instrumentation and Applications of Magnetoelastic Resonance Sensors: A Review," Sensors, vol. 11, pp. 2809-2844, Mar. 2011.
A. Viswanath, S. R. Green, J. Kosel, and Y. B. Gianchandani, "Metglas-Elgiloy bi-layer, stent cell resonators for wireless monitoring of viscosity and mass loading," Journal of Micromechanics and Microengineering, vol. 23, pp. 025010-025019, Feb. 2013.
J. Tang, S. R. Green, Y. B. Gianchandani, "Miniaturized Magnetoelastic Tags Using Frame-Suspended Hexagonal Resonators," the 27th International Conference on MEMS, San Francisco, CA, US, 2014, 4 pages.
Metglas, Inc. "Magnetic Alloy 2826MB (nickel-based) Technical Bulletin". [Online]. Available at: http://www.metglas.com. (https://metglas.com/wp-content/uploads/2016/12/2826MB-Magnetic-Alloy.pdf), 2016, 3 pages.

* cited by examiner (a) Configuration A for small quantities of tags (b) Configuration B for large quantities of tags

FRAME-SUSPENDED MAGNETOELASTIC RESONATORS

TECHNICAL FIELD

The present disclosure relates generally to magnetoelastic resonators and, more particularly, to magnetoelastic resonators capable of miniaturization.

BACKGROUND

Magnetoelastic resonators have been used in sensing applications due to certain properties of magnetoelastic materials. In the presence of a magnetic field, mechanical strain is induced in a magnetoelastic material. The induced strain results in the production of additional magnetic flux, which can be detected wirelessly. In addition, magnetoelastic resonators typically operate at a specific resonant frequency, which limits interference from spurious sources. Magnetoelastic resonators are also passive devices, meaning that they require no power sources or circuits to function. These characteristics—wireless operation, signal isolation, and passivity—make magnetoelastic resonators attractive in applications for remotely detecting, locating, or mapping items. Potential applications include, for example, tagging of inventory, wirelessly detecting blockage or leakage in piping systems or sophisticated machines, and sensing parameters in medical implants.

In one commercially successful application, magnetoelastic tags are used in electronic article surveillance (EAS) systems. Magnetoelastic tags have gained some acceptance over RF and magneto-harmonic tags in such systems, which are employed as theft-deterrent systems in libraries, supermarkets, retail stores, etc., due in part to an attractive price/performance ratio. In such systems, a rectangular strip of magnetoelastic material and a bias magnet are sandwiched between other material layers. An interrogation coil and a receiving coil are positioned at the store exit, for example, with the interrogation coil providing a magnetic field at the resonant frequency of the tag. When the tag passes between the interrogation and receiving coils, the tag resonates and induces an additional signal in the receiving coil. When the system detects the additional signal, an alarm may be activated. The bias magnet is simply demagnetized when a product is paid for or otherwise permissively taken, effectively deactivating the resonator.

Though such passive, wireless detection schemes may be desirable in many other applications, the relatively large size of commercially available magnetoelastic tags makes them impractical for many applications. For instance, a typical commercial magnetoelastic tag operating at 58 kHz is about 38 mm long, 12.7 mm or 6 mm wide and 27 µm thick. Smaller tags operating at 120 kHz, with adequate signal strength for commercial use, still have a length of about 20 mm and width of 6 mm. These magnetoelastic tags are usually strips or ribbons and the length-to-width ratio is normally larger than 3:1. Despite great improvements in signal strength and detection range provided by advancements in magnetoelastic material properties and optimized detection approaches, successful miniaturization of magnetoelastic tags has not been realized. Because response signal strength is proportional to the effective volume of magnetoelastic material, smaller resonators result in smaller signals that are more difficult to detect. In addition, the dimensional tolerances and variation present in conventional magnetoelastic material manufacturing have a greater effect on smaller resonators.

SUMMARY

In accordance with one aspect of the invention there is provided a magnetoelastic tag that includes a resonator and a resonator frame coupled with the resonator. The magnetoelastic tag includes a magnetoelastic layer, and the resonator frame is configured to support the resonator in spaced relation with respect to a substrate. In one or more embodiments, the magnetoelastic tag includes one or more of the following features:
- the resonator and resonator frame are monolithic and comprise the same magnetoelastic layer;
- the resonator has a shape with multiple axes of symmetry;
- the resonator has a hexagonal shape;
- the resonator frame circumscribes the resonator so that a gap is defined between an edge of the resonator and the frame;
- at least a portion of the magnetoelastic tag is curved out of plane so that only one or more edges of the resonator frame contact the substrate;

In accordance with another aspect of the invention there is provided a magnetoelastic sensor system that comprises a magnetoelastic tag as described in any of the previous paragraphs, and that includes a transmit coil and a receive coil. In at least some embodiments, the transmit coil is arranged in an orientation different than an orientation of the receive coil.

In accordance with another aspect of the invention, there is provided a magnetoelastic sensor that includes a plurality of frame-suspended magnetoelastic resonators. In one or more embodiments, the magnetoelastic sensor includes one or more of the following features:
- the resonators of the plurality of resonators are arranged in an array along at least one substrate.
- the resonators of the plurality of resonators are randomly oriented with respect to one another.
- at least one of the resonators of the plurality of resonators is stacked with at least one other of the resonators.
- each one of the plurality of resonators has an individual characteristic electromagnetic response to an applied magnetic field, and the plurality of resonators has an electromagnetic response to the same applied magnetic field that is equal to or greater than the sum of the individual electromagnetic responses.
- the plurality of resonators includes at least one resonator having a resonant frequency and/or size different from another resonator of the plurality of resonators.

In accordance with yet another aspect of the invention there is provided a magnetoelastic sensor system that comprises a transmit coil, a receive coil, and a magnetoelastic sensor having a plurality of frame-suspended magnetoelastic resonators.

Various aspects, embodiments, examples, features and alternatives set forth in the preceding paragraphs, in the claims, and/or in the following description and drawings may be taken independently or in any combination thereof. For example, features disclosed in connection with one embodiment are applicable to all embodiments, except where there is incompatibility of features.

BRIEF DESCRIPTION OF THE DRAWINGS

Illustrative embodiments will hereinafter be described in conjunction with the appended drawings, wherein.

DESCRIPTION OF THE ILLUSTRATED EMBODIMENTS

Described below is a frame-suspended magnetoelastic resonator combining a strong resonant response with a very small size relative to commercially available resonators. The resonator is useful in magnetoelastic tags, particularly in applications in which it is desired that such tags are inconspicuous, are used to tag very small items, or fit into relatively small spaces. By suspending the vibrating portion (i.e., the resonator) of the tag with respect to a substrate or carrier, interaction between the resonator and the substrate can be lessened, minimized, or eliminated, thereby providing a strong resonant response from a miniaturized tag. This enables significant miniaturization of magnetoelastic resonators. As described in the examples below, magnetoelastic tags with suspended resonators can be made about $1/100^{th}$ the size of commercially available magnetoelastic tags while providing a signal strength about 75 times that of similarly sized tags with unsuspended resonators. In other words, suspended magnetoelastic resonators can be significantly miniaturized while maintaining useful signal strengths. In addition, a plurality of suspended resonators can be arrayed or clustered to boost signal strength even further via signal superposition.

This miniaturization of magnetoelastic resonators paves the way for their use in a variety of applications not before possible and comes with several advantages for current magnetoelastic resonator applications. For example, a much smaller magnetoelastic tag is less conspicuous as used in anti-theft systems. Miniaturized tags can be helpful in the management of inventories, particularly with critical items like surgical instruments. For example, immediately after surgery, the patient can be scanned to ensure no instruments have mistakenly been left in the surgical site, which is a relatively common problem. Any reusable instruments can be checked back into inventory after sterilization; meanwhile, the tags do not add significantly to the cost of any tagged disposable instruments. It is also possible to tag different instrument types with tags that have different resonant signatures, which would provide more specificity in inventory tracking. Miniaturization also brings other benefits, such as reducing costs and increasing the resonant frequency. Reduced size contributes to less use of magnetoelastic materials and ferromagnetic biasing materials. High resonant frequencies provide less electronic noise that has a 1/f frequency spectrum. A high resonant frequency also facilitates miniaturization of antennas, as antenna size decreases with an increase in operating frequency. While the particularly illustrated embodiments below include hexagonally shaped resonators and tags, some of the benefits of which are subsequently described, suspended resonators can be made in a variety of shapes while achieving the benefits of enhanced signal strength over unsuspended resonators.

Figure 1:
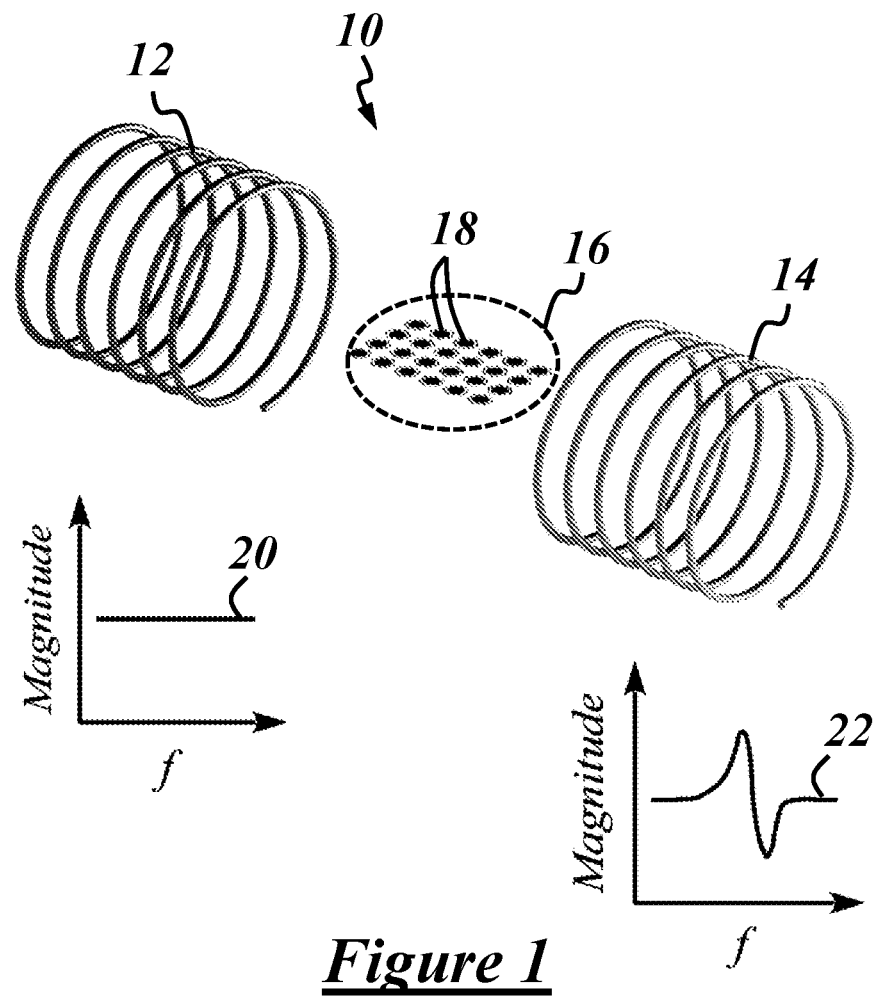
FIG. 1 illustrates an example of a magnetoelastic sensor system in which the presence of one or more magnetoelastic tags can be detected using a transmit coil and a receive coil.
Figure 1A:
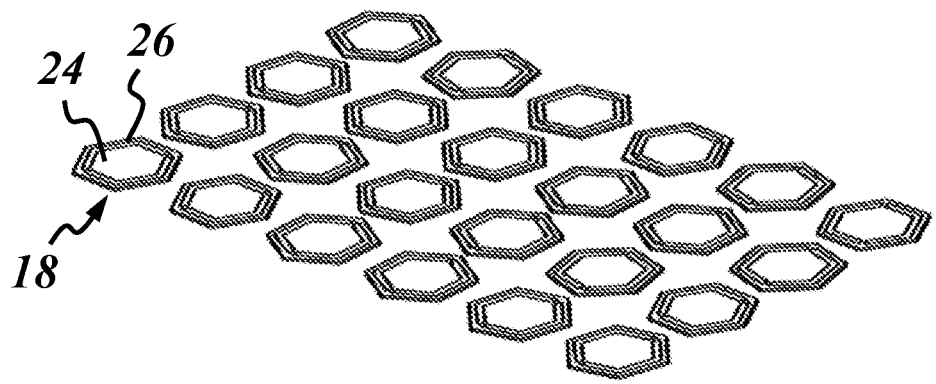
FIG. 1A is an enlarged view of the array of magnetoelastic tags of FIG. 1 in various orientations.

FIG. 1 illustrates an example of a magnetoelastic sensor system 10, including a transmit coil 12, a receive coil 14, and a magnetoelastic sensor 16 including one or more magnetoelastic tags 18. The sensor 16 may also include one or more bias magnets or some other magnetic field source (not shown in FIG. 1). In one embodiment, the sensor 16 includes an individual permanent bias magnet for each magnetoelastic tag 18, and each bias magnet may have a geometry similar to that of each of the magnetoelastic tags 18. One suitable bias magnet material is Amokrome™ (an iron-chromium-cobalt alloy), but other high coercivity materials are also suitable.

Each magnetoelastic tag 18 includes a magnetoelastic material in which mechanical strain is induced when in the presence of a magnetic field. In the presence of an AC magnetic field, the magnetoelastic material can be made to resonate. The resonating magnetoelastic material produces a magnetic flux, whether the vibration is induced by an AC magnetic field or in some other way. In the illustrated example, the transmit coil 12 provides the AC magnetic field. A voltage is induced in the receive coil 14 by the magnetic flux produced by the resonating magnetoelastic material in addition to the voltage induced in the receive coil by the applied AC magnetic field. The AC magnetic field thus results in a baseline signal 20, and the presence of the magnetoelastic sensor 16 is detected by a deviation from the baseline signal 22 when the frequency or frequency range of the applied AC magnetic field matches the resonant frequency of one or more of the magnetoelastic tags 18. The resonant operation of the tags 18 is advantageous, as it limits interference from spurious sources.

The magnetoelastic tagging system 10 is not limited to the configuration of FIG. 1. The interrogating and detecting approaches can both be different for a variety of applications. For example, a pulsed signal rather than a continuous wave signal can be used for the interrogating magnetic field (i.e., the applied field from the transmit coil 12), and/or the receive coil 14 can pick up the signal generated during "ring-down" vibration of the tags. Such configurations can allow temporal separation of the tag signal from that induced by the interrogating magnetic field. The magnetic flux detection scheme can also be replaced by acoustic or optical approaches.

Figure 2:
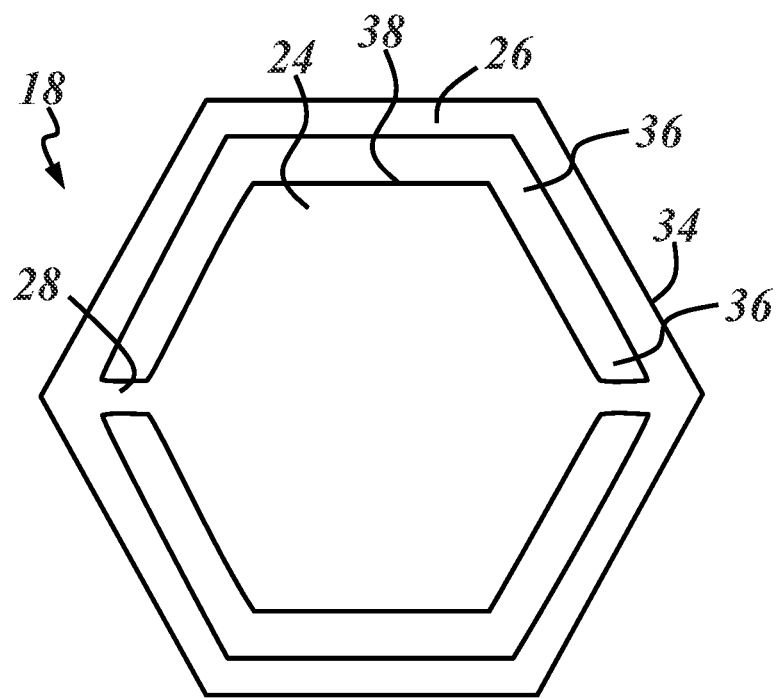
FIG. 2 is a plan view of a frame-suspended magnetoelastic resonator.

FIG. 2 is a plan view of one example of the magnetoelastic tag 18 which includes a resonator 24 and a resonator frame 26. This embodiment of the magnetoelastic tag 18 is a frame-suspended tag, where the frame 26 can alone support, locate, and/or orient the resonator 24 with respect to other tag or sensor components. The resonator 24 includes a magnetoelastic material, which is in the form of a layer of magnetoelastic material in this example. The resonator frame 26 is coupled with the resonator via couplings or bridges 28 and can function to lessen, minimize, or eliminate contact between the resonator 24 and a substrate or encasement (not shown in FIG. 2). For instance, the frame 26 can be configured to support the resonator with respect to the substrate so that at least a portion of the resonator is spaced apart from the substrate.

Figure 3A:
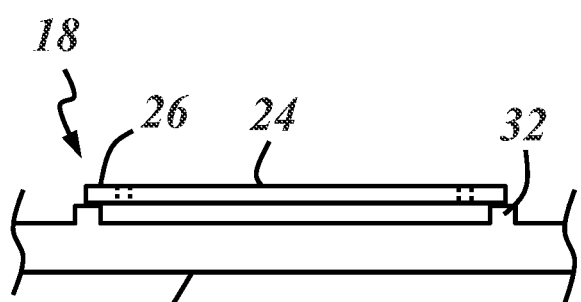
FIGS. 3(a)-3(b) are side views of the frame-suspended magnetoelastic resonator, showing the resonator spaced from a substrate.
Figure 3:
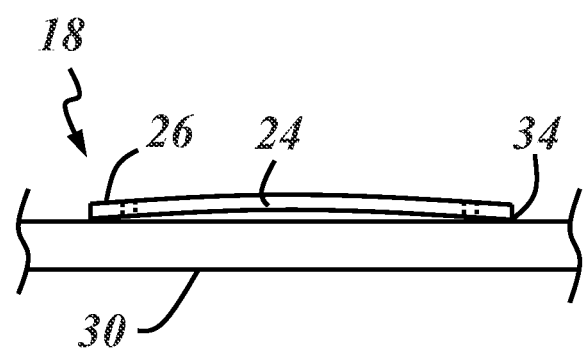

Some examples are illustrated in side views of the magnetoelastic tag 18 in FIG. 3. In FIG. 3(a), the frame 26 supports the resonator 24 so that the entire resonator is spaced apart from the substrate 30. In this example, the frame 26 is supported by stand-off features 32, which may or may not be part of the substrate 30 or part of the frame. In FIG. 3(b), the magnetoelastic tag 18, including the magnetoelastic resonator 24, includes a small amount of out of plane curvature so that only edges 34 of the resonator frame 26 contact the substrate 30. In other embodiments, the substrate includes curvature to help space the resonator from the substrate. And in some cases, the frame 26 may be fabricated as part of the substrate 30. The frame 26 may or may not be attached to the substrate 30 or stand-off features 32, and in some cases, the tag 18 includes one or more substrate layers on each of the oppositely facing sides of the resonator 24.

In the example illustrated in FIG. 2, the resonator 24, resonator frame 26, and the couplings 28 are one monolithic piece, meaning that they are formed together as one piece from the same material, which in this case is the magnetoelastic layer. The frame 26 and/or couplings 28 may also be formed from a different material. Any or all of the resonator 24, the frame 26, and the couplings 28 may include a layer of magnetoelastic material deposited over or otherwise bonded with another material layer, such as a layer of silicon. In one particular example, the resonator 24, frame 26, and couplings 28 each include a layer of silicon or other non-magnetoelastic material, and the resonator further includes a layer of magnetoelastic material.

Both the resonator 24 and the frame 26 are hexagonal in shape in the illustrated embodiment. The frame 26 circumscribes the resonator 24 to define a gap 36 between an edge 38 of the resonator and the frame. The couplings 28 bridge the gap 36 at one or more locations to couple the resonator 24 with the frame 26. The quantity and size of the couplings 28 may vary and can affect the resonant frequency of the tag 18. The couplings 28 are preferably located at nodes or null-vibration regions of the resonator 24. The quantity and/or width of each coupling 28 may be minimized to the extent that the couplings are sufficiently durable for the life of the particular application. Larger sizes or quantities of couplings 28 may generally decrease the responsiveness of the tag 18 and/or increase the resonant frequency beyond the range of practical detection. The geometry of the couplings 28 may also deviate from the straight structure shown here, to geometries that are serpentine in form, for example.

The illustrated hexagonal shape offers certain advantages, such as reduced or minimized material waste during fabrication, due to the manner in which hexagonal shapes can be packed together side-by-side along a flat sheet of material. The hexagonal shape also has multiple lines of symmetry extending through the center of the hexagon and reduces the sensitivity of the resonator to orientation with respect to the applied magnetic field, as described further below. However, resonators of any shape may benefit from the frame-suspended configuration described here. For instance, the above-described EAS tags, which typically include a rectangular strip of magnetoelastic material sandwiched between packaging layers, can achieve the same or increased signal strength in a reduced size by suspending the magnetoelastic material with respect to the packaging layers and thus limiting its contact with the packaging layers.

Exemplary miniaturized magnetoelastic tags with a maximum dimension near 1 mm have been modeled, fabricated, and evaluated as described below. The fabricated tags are about 1/100$^{th}$ the size of commercially available magnetoelastic tags and have a signal strength about 75 times similarly sized unsuspended tags at about the same resonant frequency and with quality factors of 100 to 200.

A custom magneto-mechanical harmonic finite element technique was used to estimate displacements, mode shapes, and resonant frequencies for the magnetoelastic tags. Although magnetoelastic materials are generally non-linear, it is appropriate to use linearized constitutive equations describing the coupling between flux, field strength, stress, and strain in a magnetostrictive material:

$$\vec{\sigma} = [C]\vec{\varepsilon} - \frac{[C][d]^T}{\mu_0 \mu_r}\vec{B} \quad (1)$$

$$\vec{H} = -\frac{[d][C]}{\mu_0 \mu_r}\vec{\varepsilon} + \frac{1}{\mu_0 \mu_r}\vec{B} \quad (2)$$

where σ is the stress vector, C is the stiffness matrix, ε is the strain, d is the magnetostrictivity matrix, B is the magnetic flux density vector, H is the field strength vector, $\mu_0$ is the permeability of free space, and $\mu_r$ is the relative permeability. Equations (1) and (2) were implemented using COMSOL Multiphysics software (Comsol, Inc., Burlington, Mass., USA) with coupled magnetic and structural domains for time-harmonic induction current and stress-strain frequency response. Magnetoelastic tags in a hexagonal shape were modeled using parameters derived from experimental results of magnetoelastic resonators placed directly on a substrate.

A DC magnetic field bias was used to ensure a strong signal response from the magnetoelastic material. The DC field was used to shift the operating point of the material to where the strain is most sensitive to the applied AC magnetic field. The magnitude of the magnetoelastic response is proportional to the magnitude of the applied AC magnetic field. In order to estimate the applied AC magnetic field strength for specific experimental setups, transmit coils were modeled separately in COMSOL Multiphysics. Because of the disparity in size between the relatively large coils and the relatively small magnetoelastic tags, it was appropriate to first calculate the magnetic field strength generated by the coils in a separate model, and then use the calculated value as exciting conditions in the customized magneto-mechanical model that is spatially focused on a single magnetoelastic tag. The current applied to the transmit coils was first measured experimentally, and then implemented in the FEA models. For the characterization of small and large quantities of magnetoelastic tags, two different experimental setups were used (configurations A and B). Detailed descriptions of these two configurations are described further below.

Figure 4:
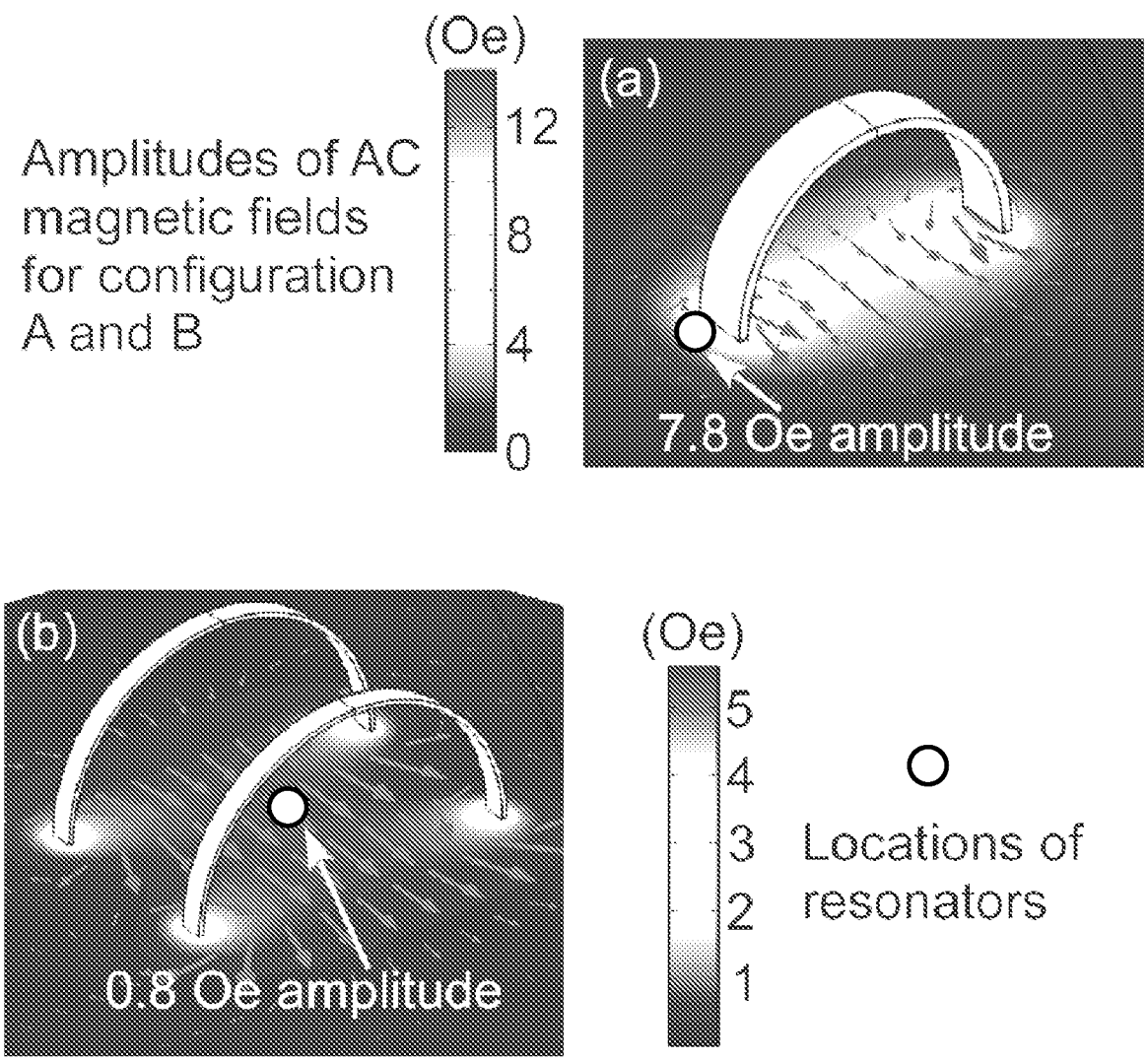
FIG. 4 illustrates FEA results of interrogating signal strength for two different experimental configurations: configurations A and B.

FIG. 4 shows the FEA simulation results of interrogating signal strength for configurations A and B, illustrating that the amplitude of the AC magnetic fields at tag locations for configurations A and B are calculated as 7.8 Oe and 0.8 Oe, respectively. The pre-calculated AC magnetic field strength was used for modeling the resonant response of hexagonal magnetoelastic tags in the magnetomechanical coupled FEA model described above. The hexagonal tag has an effective diameter of 1.3 mm and is 27 µm thick.

Figure 5A:
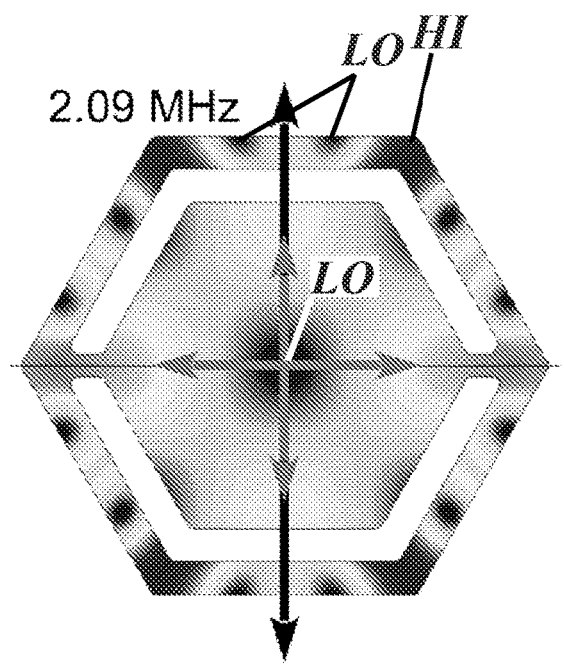
FIG. 5 illustrates finite element analysis (FEA) results for a frame-suspended hexagonal resonator: (a) unattached to a substrate, and (b) with the resonator frame fixed to a substrate.

FIG. 5(a) shows the calculated mode shape of the hexagonal tag at a resonant frequency of about 2.09 MHz with the resonator frame unattached to a substrate. The mode shape exhibits both longitudinal and transverse motion, generating an oscillating magnetic field with one significant response component (horizontal in FIG. 5(a)) that is orthogonal to the transmitted magnetic field (vertical in FIG. 5(a)), facilitating the decoupling of the transmit signal from the receive signal by orienting the transmit coil and receive coil orthogonally.

Figure 5B:
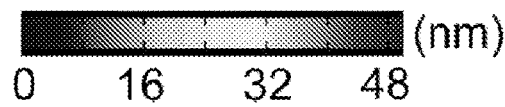
Figure 5B:
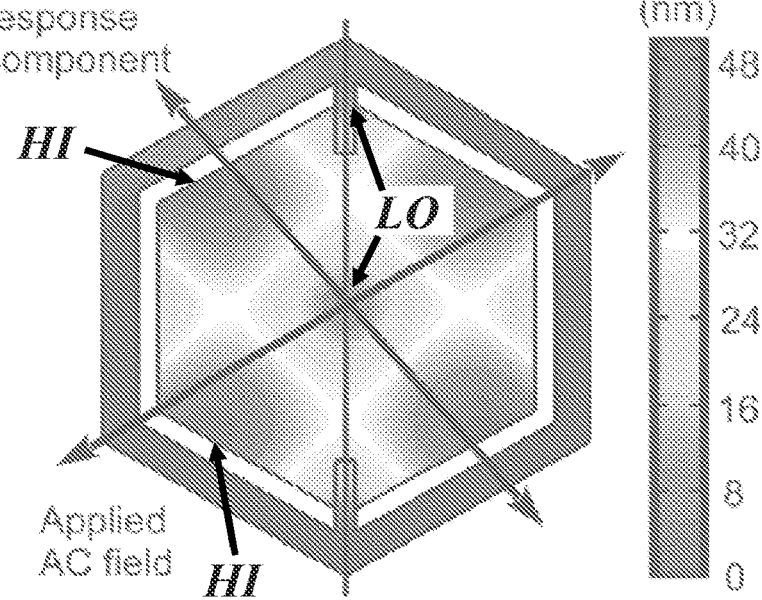

FIG. 5(b) shows the calculated mode shape of the hexagonal tag at the same resonant frequency with the resonator frame fixed to a substrate. In this example, the direction of the applied AC field is corner-to-corner. The mode shape exhibits both longitudinal and transverse motion, generating an oscillating magnetic field with a major response component that is approximately orthogonal to the applied AC field, facilitating the decoupling of the transmit signal from the receive signal by orienting the transmit coil and receive coil orthogonally. Because the original FEA results are colored charts, both the high and the low displacement regions of each tag appear as dark areas when converted to grayscale. For clarity in FIGS. 5(a) and 5(b), the low displacement regions (about 10 nm or less) are labeled "LO," and the highest displacement regions are labeled "HI."

As described above, the frame suspension is intended to provide a significant signal amplitude advantage by allowing the vibrating portion of the tag to move with minimal interaction with the substrate. This advantage can be realized by selectively supporting the resonator frame using a proper package design or substrate. It may also be achieved by providing the tags with a slight curvature and orienting the convex side of the tag away from the substrate, as shown for example in FIG. 3(b). Exemplary fabrication processes, including the initial casting and photochemical machining (PCM) described in further detail below, can induce slight longitudinal curvature into the finished structure. With the convex surface away from the substrate, only the perimeter of the resonator frame contacts the substrate, allowing the central resonator to oscillate with minimum interaction with the supporting substrate.

Figure 6:
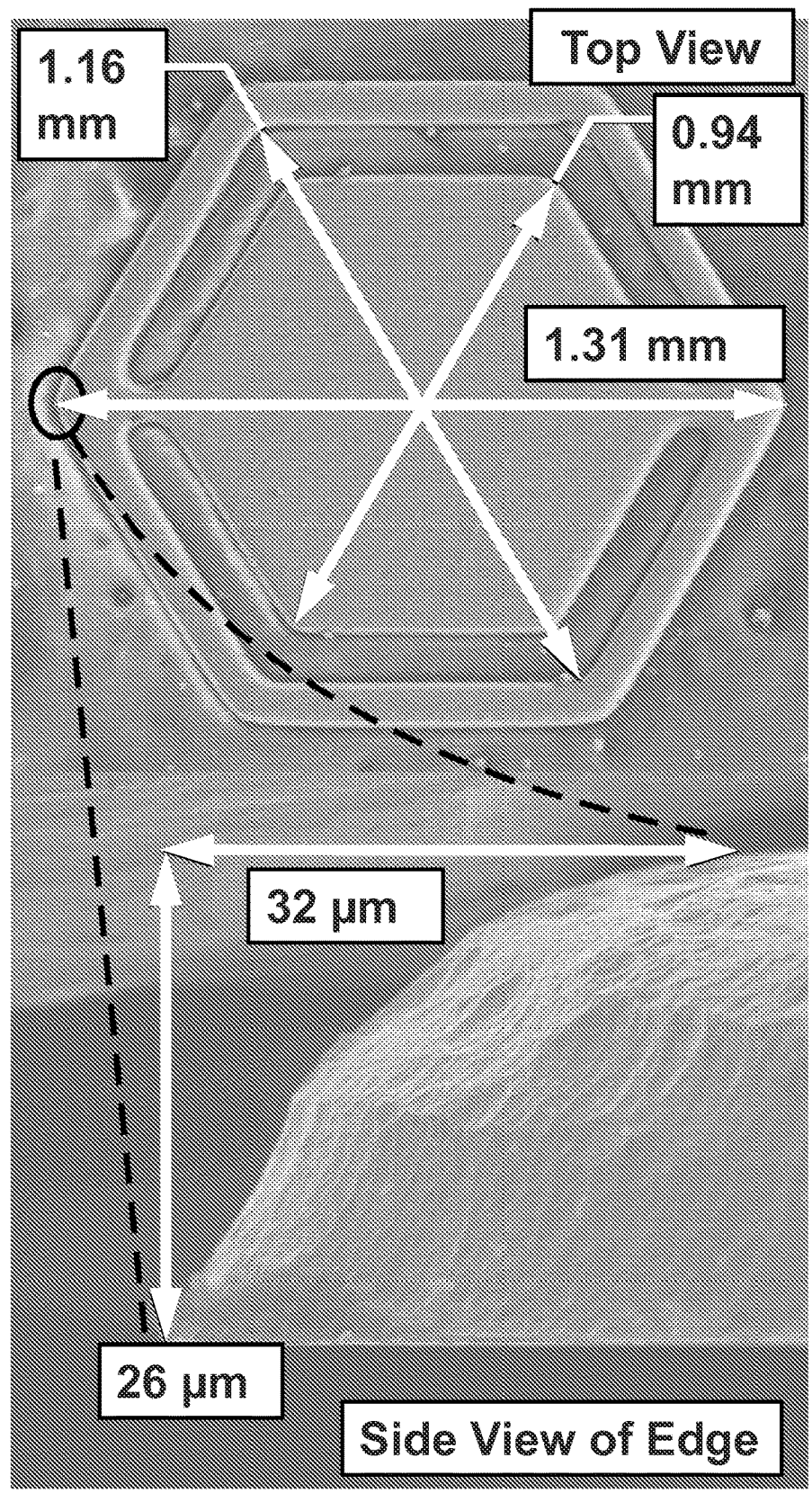
FIG. 6 is a composite scanning electron microscope (SEM) image including a top view of a fabricated frame-suspended hexagonal resonator and an enlarged side view of an edge of the resonator frame.

Magnetoelastic tags were batch patterned from an approximately 27 µm-thick foil of as-cast Metglas™ 2826 MB, an amorphous NiFeMoB alloy, using a tabless PCM process. In this process, the Metglas thin foil was laminated with photoresist film on each side. The photoresist films were then lithographically patterned, resulting in selective removal of portions of the photoresist films to expose the magnetoelastic material beneath. The exposed material was etched away by an acid spray, leaving the patterned Metglas structures. In conventional PCM fabrication processes, the material is patterned to include tabs that keep the devices connected to the foil throughout the etch process. In the tabless process used here, hundreds of tags are allowed to drop from the Metglas foil automatically during the etching process, eliminating the extra time, cost, and geometrical variability resulting from the typical additional tab removal process. Approximately 1000 hexagonal tags (resonator and frame) were fabricated. As shown in the SEM image of FIG. 6, the lateral undercut for sidewalls of the hexagonal tags was about 32 µm. This is small relative to the size of the tag, which facilitates predictability and consistency in the resonant frequency across a batch of tags.

Figure 7:
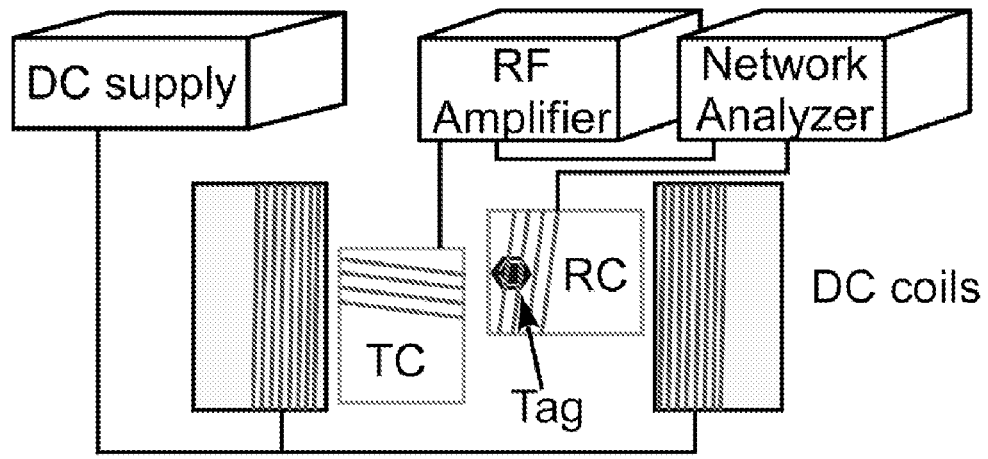
FIG. 7 is a schematic illustration of experimental configurations A and B.
Figure 7:
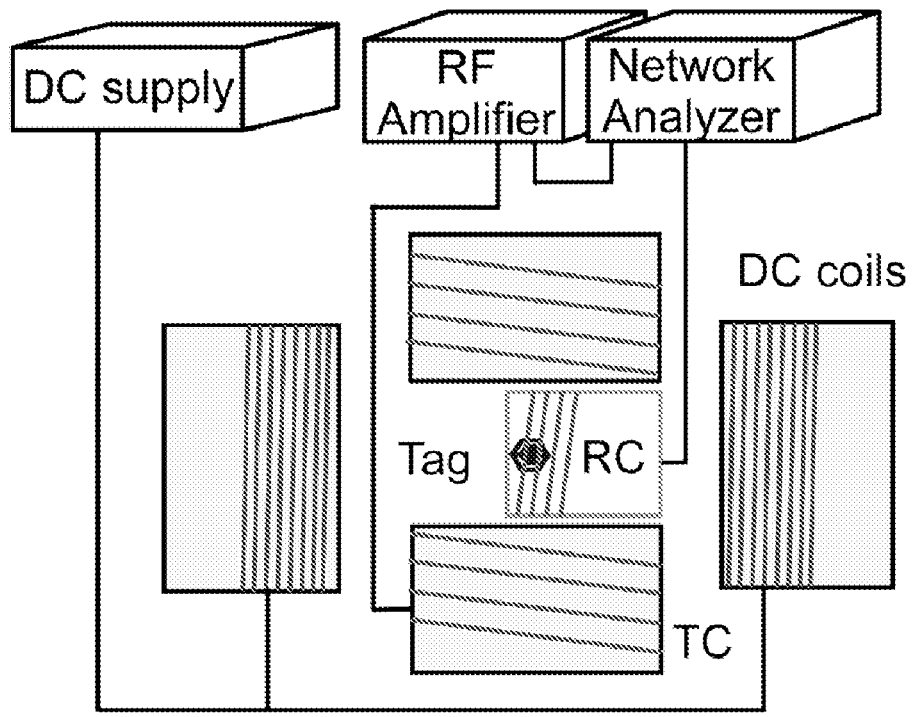

FIG. 7 includes schematic illustrations of configurations A and B. Configuration A was used for relatively small quantities of magnetoelastic tags, and configuration B was used for relatively larger quantities. Both configurations include a network analyzer, an RF amplifier, and a receive coil. For these tests, the magnetic bias field was provided by DC Helmholtz coils. In other embodiments, permanent magnets or other suitable elements may provide the bias field. The transmit coils and the receive coil were arranged orthogonally. The symmetry of the resonators and the combined longitudinal and transverse motion of the mode shape result in the oscillating magnetic field produced in response to the interrogation being orthogonal to the direction of the transmitted oscillating magnetic field. This arrangement of coils and the symmetric design of the resonators facilitates decoupling of the transmit signal from the received signal, reducing signal feed-through and enhancing the response of the tags. For all data presented below, the baseline signal feed-through (without tags present) has been subtracted.

The network analyzer swept the frequency of the input signal, which was sent to the amplifier and to the transmit coil. The transmit coil generated an oscillating magnetic field, causing the tag to resonate and generate an additional magnetic field. This additional magnetic field induced additional voltage in the receive coil, which was measured by the network analyzer, indicating the presence of the tag.

In configuration A, illustrated in FIG. 7(a), the transmit and receive coils were positioned about 0.5 cm away from each other. Quantities of tags from 1 to 10 were positioned next to the transmit coils to provide a strong interrogation field. Because the signal strength of hundreds of resonators was expected to be stronger, Helmholtz transmit coils were used in configuration B, illustrated in FIG. 7(b), to increase the interrogation distance and to provide a uniform excitation field.

The transmit and receive coils of configuration A had a diameter of 3.6 cm. The Helmholtz transmit coils of configuration B had a diameter of 7.2 cm and were separated by 3.6 cm. Both configurations used the same receive coil. The transmit and receive coils were turned using 60-stranded 22 AWG Litz wire, in which each individual conducting strand is insulated. For oscillating currents at the relatively high frequencies employed here, the skin effect in a conductor is important in determining the overall impedance of the conductor. The individually-insulated strands in the Litz wire provide higher conductance for high frequency signals compared to fewer strands with the same total cross-sectional area.

Figure 8:
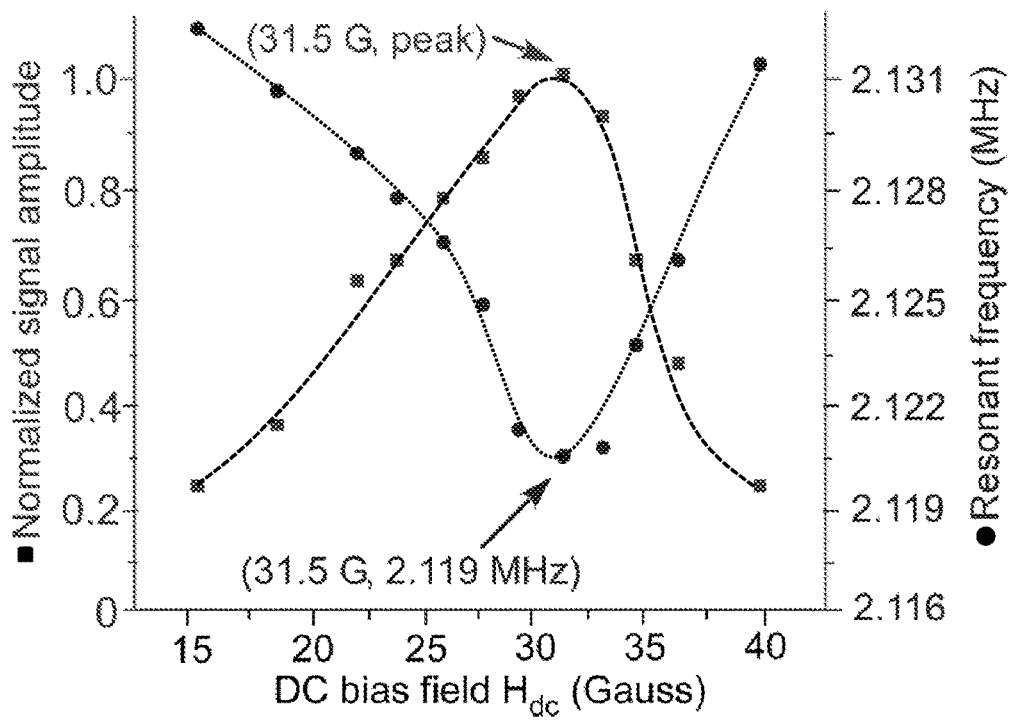
FIG. 8 is a plot of normalized signal amplitude and resonant frequency as a function of DC magnetic field bias for a single frame-suspended hexagonal resonator.

FIG. 8 is a plot showing the typical measured signal amplitude and resonant frequency of a hexagonal tag as a function of DC bias field strength. The signal amplitude is at its maximum and the resonant frequency is at its minimum with a 31.5 Oe DC bias field. Though not shown here, the optimum DC bias field was similarly determined experimentally to be 33 Oe. Because the signal amplitudes of magnetoelastic tags vary with different experimental setups and measurement conditions, the signal amplitudes presented herein are normalized to the measured maximum signal amplitude of a single frame-suspended hexagonal tag with an optimized DC bias. The dotted lines shown in FIG. 8 are not necessarily best-fit curves and are only approximations intended to illustrate the generally concave-up and concave-down shapes of the respective curves.

Figure 9:
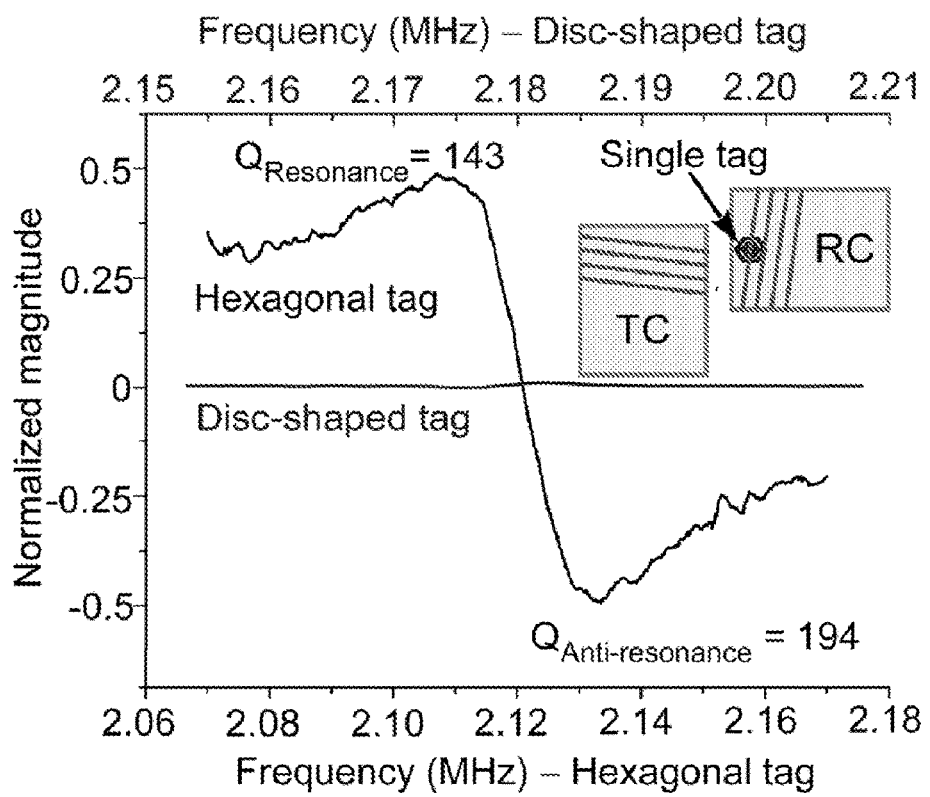
FIG. 9 is a plot of normalized resonant response as a function of frequency for a suspended hexagonal resonator and for an unsuspended circular resonator of the same diameter.

As shown in FIG. 9, the measured signal amplitude of the frame-suspended hexagonal tags was about 75 times that of the unsuspended discs tags of the same diameter. The resonant response of the frame-suspended hexagonal tags showed quality factors in a range from 100 to 200.

Figure 10A:
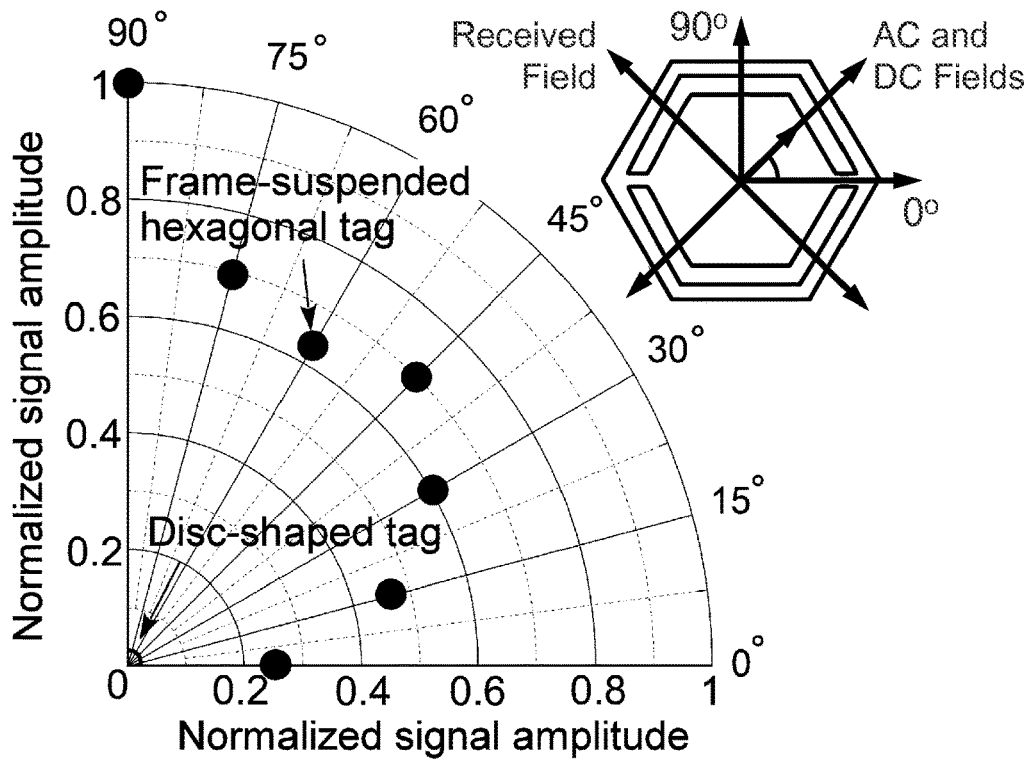
FIGS. 10(a) and 10(b) illustrate plots of normalized signal amplitude as a function of orientation of azimuthal angle of different applied magnetic fields for a hexagonal resonator and for an unsuspended circular resonator of the same diameter.
Figure 10B:
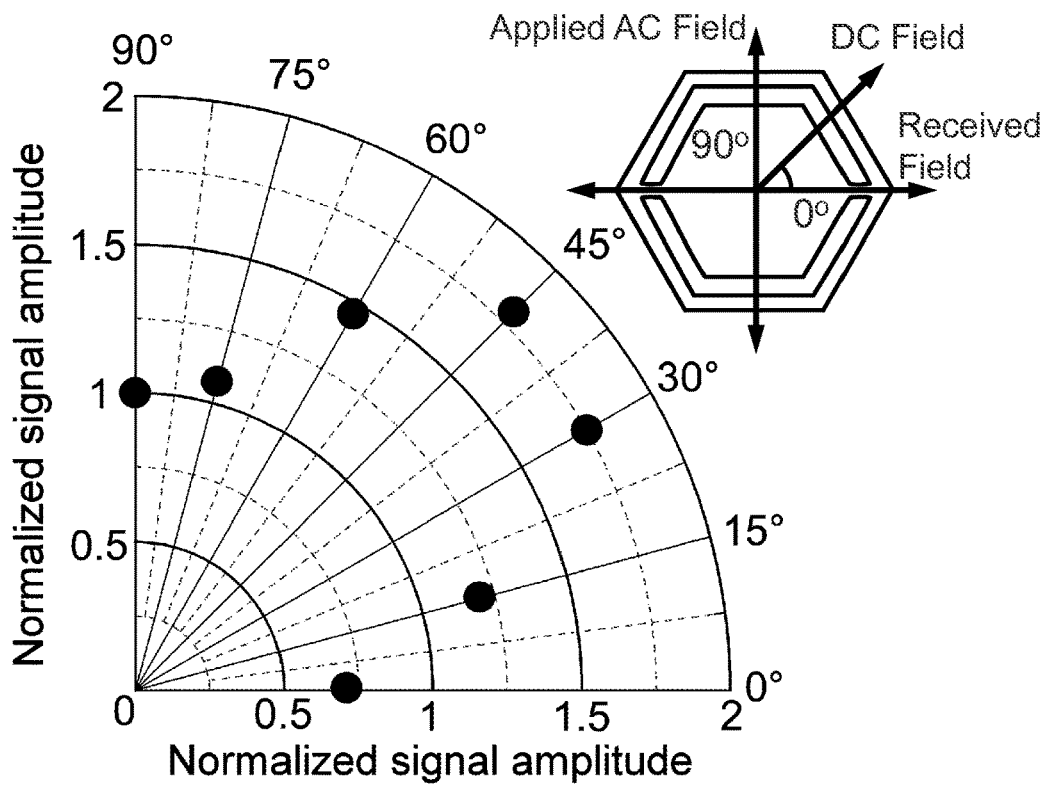

Compared to azimuthally symmetric disc tags, hexagonal tags with frame-suspensions exhibit some variation in signal amplitude with different azimuthal orientations of the applied magnetic fields. FIG. 10(*a*) is a plot showing experimentally determined signal amplitude as a function of azimuthal angle of the applied AC magnetic field. The DC bias field and the applied AC field have the same orientation and the received field is orthogonal to these applied fields. FIG. 10(*b*) is a similar plot in which the applied AC field and received field are maintained at 90° and 0°, respectively, relative to the tag, with the relative orientation of the DC bias field being changed. In both FIGS. 10(*a*) and 10(*b*) the signal amplitudes are normalized to the maximum signal amplitude measured with the applied AC field and DC bias aligned with each other at 90° with respect to the tag, as used in (a). Although signal amplitude varies with angle for the frame-suspended hexagonal resonators, the magnitude of the signal is larger than that of the unsuspended disc-shaped resonators in every orientation.

Figure 11:
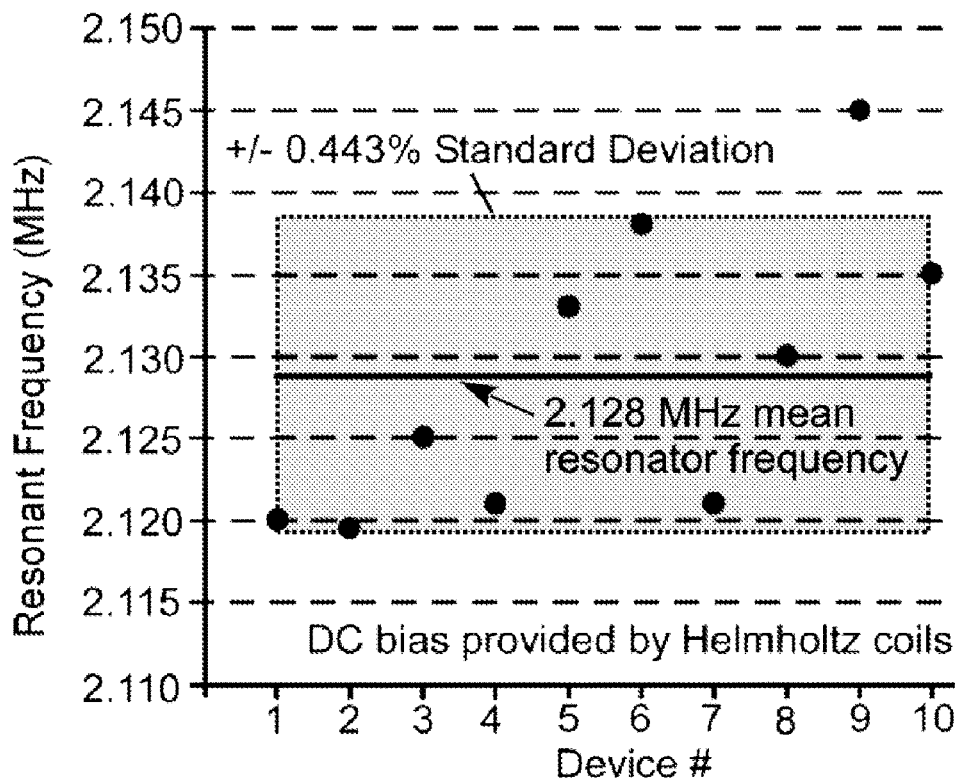
FIG. 11 is a plot of the resonant frequencies of a plurality of individual frame-suspended resonators.

The responses of multiple individual frame-suspended hexagonal resonators were measured to evaluate the variability in resonant frequency among individual tags. As shown in FIG. 11, in a sample of 10 hexagonal tags, the average resonant frequency was 2.128 MHz with a 0.44% standard deviation. The small process variability facilitates signal superposition when the tags are arrayed or clustered.

Figure 12:
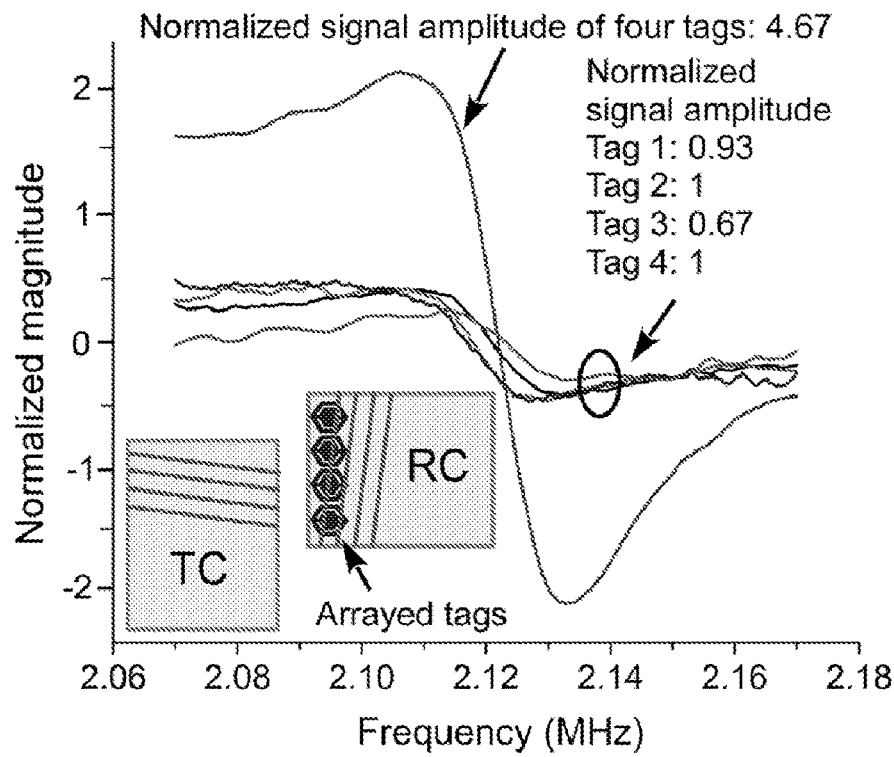
FIG. 12 is a plot of normalized signal amplitude as a function of frequency for a plurality of resonators, measured both individually and while in an array.
Figure 13:
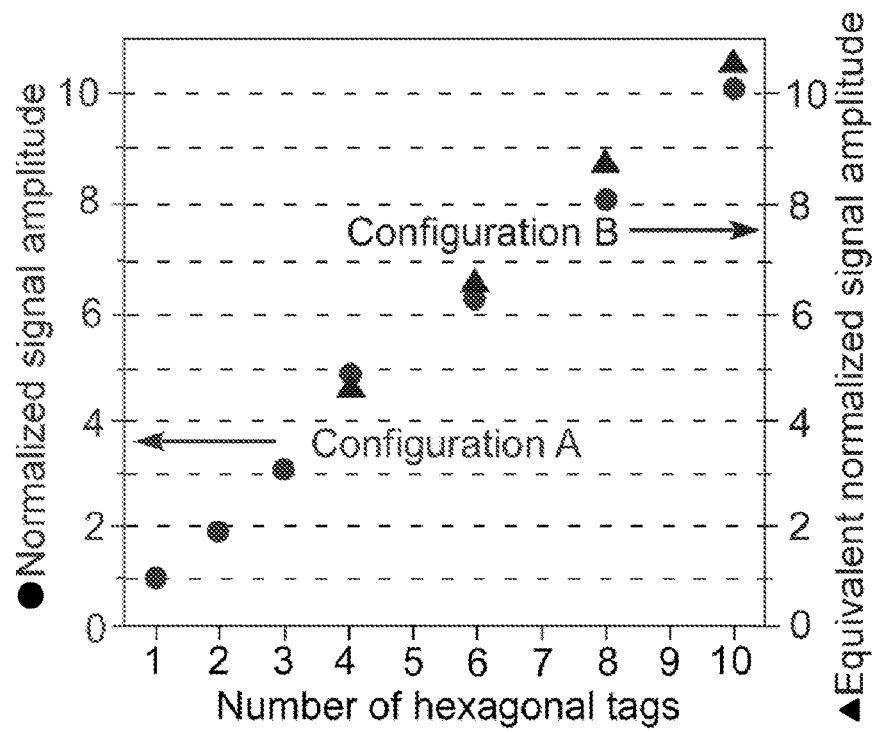
FIG. 13 is a plot of normalized signal amplitude as a function of the total number of resonators of an array of resonators.

Signal superposition for small quantities (up to 10) of the hexagonal tags was measured using configuration A. For this evaluation, the tags were placed in a 2-by-5 array in the proximity of the AC transmit coil. The DC Helmholtz coils were placed 6 cm away from the tags to provide the DC bias field. As shown in FIG. 12, signal superposition is evident with a quantity of four tags. When tested individually, the peak-to-peak amplitude of the four tags varied from 100 µV to 150 µV, and their resonant frequency ranged from 2.118 to 2.127 MHz. When tested together, the peak-to-peak response was 700 µV, and the resonant frequency was 2.123 MHz. The normalized signal amplitude of the four tags combined was greater than the sum of the individually determined signal amplitudes. As shown in FIG. 13, the increase in signal strength with an increasing number of arrayed tags is approximately linear for small numbers of tags. In FIG. 13, configuration A data is plotted along the left-hand axis with circles as data points.

The resonant responses of small quantities of tags were experimentally measured using configuration B, as well, and normalized to the response of a single tag in configuration A. As described above, FEA simulation results showed that the amplitudes of the AC interrogating magnetic field for configurations A and B were 7.8 Oe and 0.8 Oe, respectively. The equivalent normalized signal amplitudes for 4, 6, 8 and 10 tags in configuration B were calculated by multiplying measured signal amplitudes by the ratio of the simulated magnetic field strengths: 7.8 Oe/0.8 Oe. In FIG. 13, configuration B data is plotted along the right-hand axis with triangles as data points. The normalized signal amplitudes measured by the two different configurations A and B match up well.

Figure 14:
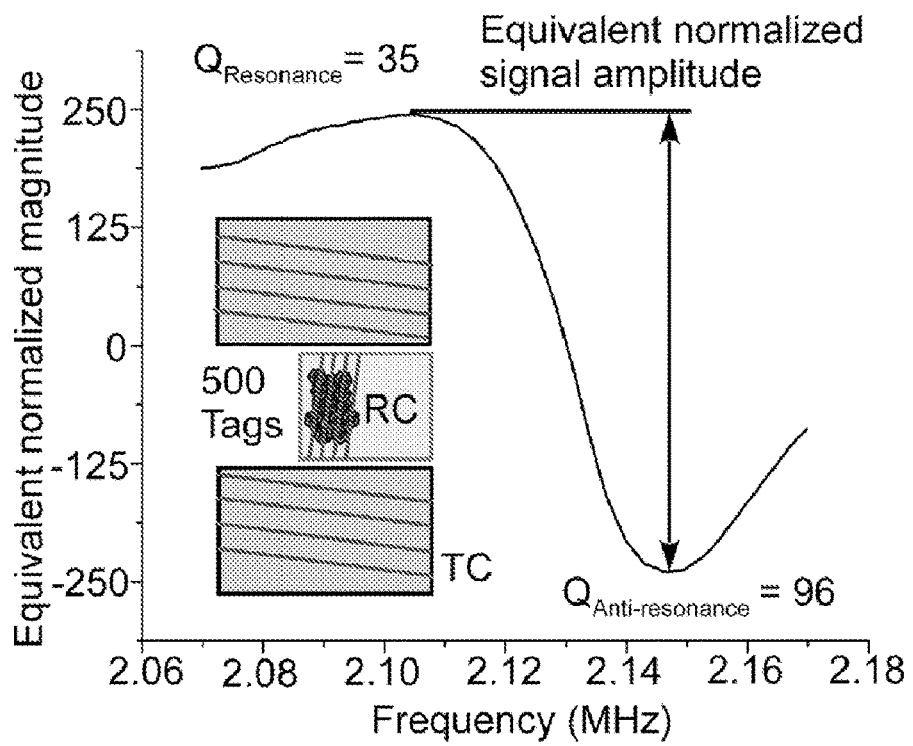
FIG. 14 is a plot of equivalent normalized signal amplitude as a function of frequency for a cluster of 500 randomly oriented resonators.

The frequency responses of large clusters (100-500) of the fabricated hexagonal tags were also experimentally evaluated. These tags were randomly oriented with respect to one another because of the difficulty in arraying such large quantities with preferred orientation and/or with convex surfaces away from the substrate. FIG. 14 shows a typical resonant response for 500 hexagonal tags with frame suspension at a resonant frequency of 2.13 MHz, resulting in a signal amplitude approximately 500 times the signal amplitude obtained from a single tag. In addition to being randomly oriented, the large clusters of tags were also evaluated stacked one over another. In some embodiments of the magnetoelastic sensor that include a plurality of frame-suspended resonators, individual resonators are stacked one over the other. The stacked configuration can be combined with random orientation or arrayed configurations. For example, a plurality of frame-suspended resonators can be arranged in a three dimensional array. The ability to stack magnetoelastic tags to increase signal strength without increasing the diameter or spatial area required to fit the tags into may be advantageous in many applications, including the above described EAS applications.

Figure 15:
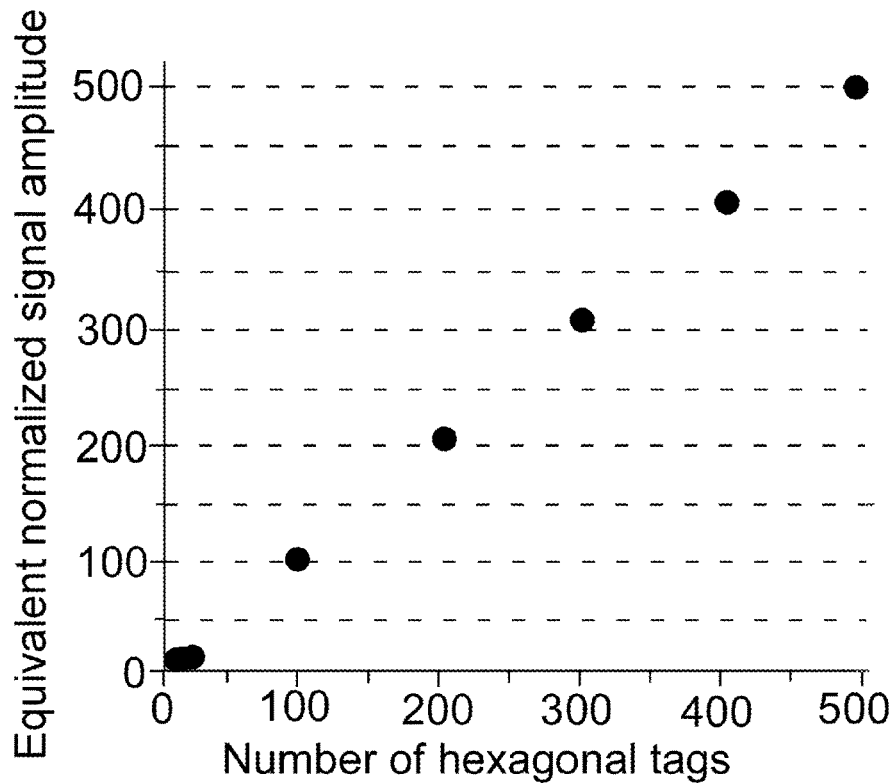
FIG. 15 is a plot of equivalent normalized signal amplitude as a function of the number of resonators, from 1 to 500, in a cluster.
Figure 16:
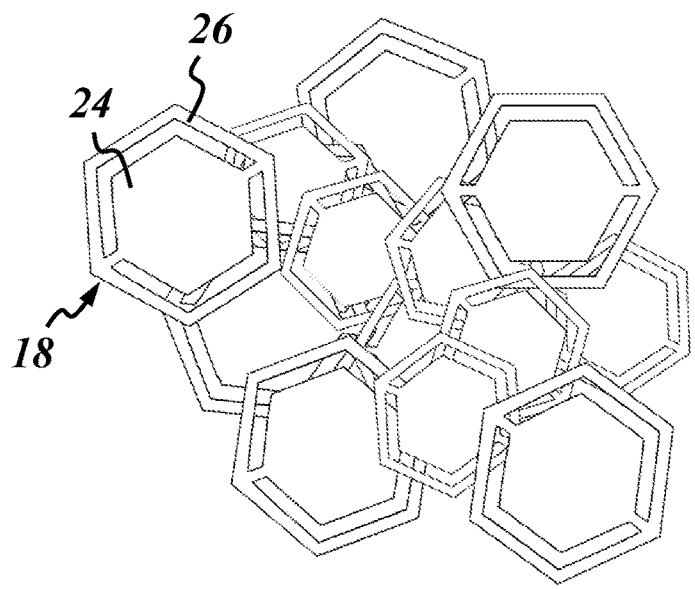
FIG. 16 is an enlarged view of a portion of another example of a cluster of randomly oriented resonators.

As shown in FIG. 15, although there may be some signal loss due to random resonator orientation and position, the signal amplitude varied in approximately linear fashion with the number of tags in a cluster. It is believed that the interaction between tags may contribute to compensation of the signal loss expected by random tag orientation and placement.

While Metglas™ 2826 MB is one suitable magnetoelastic material for use in the above-described resonators and tags, other amorphous alloys with high magnetostrictivity and sufficient mechanical properties that will operate with a modest DC bias field are suitable as well and may provide even better performance. Other magnetostrictive materials such as Terfenol-D or Galfenol may be used in bulk or thin film form in similar geometries and/or with different fabrication processes. Although the above-described PCM process is a good choice for fabrication of hundreds of magnetoelastic tags, other low cost fabrication processes capable of producing large quantities may also be suitable. Metglas and other amorphous magnetoelastic alloys can be fabricated with desired geometry by metal alloy quenching, for example, in which metal powders or granules with preselected portions are melted and homogenized, and then rapidly quenched on a surface or in a recess with the desired geometry.

The detection range of magnetoelastic tags is sometimes limited by the interrogation and detection approach, particularly with respect to the manner in which the detection approach accommodates transmitter-to-receiver feedthrough. The above-described coil configurations employ spatial separation of transmit and receive signals afforded by the coupled longitudinal and transverse resonant motion of the tags. However, other approaches may complement this approach and further enhance transmitter-to-receiver isolation and thereby increase detection range. For example, a pulsed interrogating signal can be used, and the magnetic flux generated during the "ring-down" vibration of the tags could be detected so that the excitation signal is temporally decoupled from the received signal. An acoustic interrogating signal, instead of a magnetic field signal, could also be used for decoupling the excitation signal from the receive signal.

It is to be understood that the foregoing description is of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example," "for instance," and "such as," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

The invention claimed is:

1. A magnetoelastic tag, comprising:
a resonator comprising a magnetoelastic layer; and
a resonator frame coupled with the resonator and configured to support the resonator in spaced relation with respect to a substrate, wherein the resonator has a shape with multiple non-orthogonal axes of symmetry, and
wherein the resonator is suspended from the frame along an outer perimeter of the resonator by one or more couplings, each coupling extending from an edge of the frame to the outer perimeter of the resonator and attaching the resonator to the frame.

2. A magnetoelastic tag as defined in claim 1, wherein said shape has rotational symmetry.

3. A magnetoelastic tag as defined in claim 1, wherein said shape is a hexagon.

4. A magnetoelastic tag as defined in claim 1, wherein the resonator and resonator frame are monolithic and comprise the same magnetoelastic layer.

5. A magnetoelastic tag as defined in claim 1, wherein the resonator frame circumscribes the resonator so that a gap is defined between an edge of the resonator and the frame.

6. A magnetoelastic tag as defined in claim 1, wherein at least a portion of the magnetoelastic tag is curved out of plane so that only one or more edges of the resonator frame contact the substrate.

7. A magnetoelastic tag as defined in claim 1, wherein the resonator is suspended within the frame.

8. A magnetoelastic sensor system comprising the magnetoelastic tag of claim 1, a transmit coil, and a receive coil.

9. The magnetoelastic sensor system of claim 8, wherein the transmit coil is arranged in an orientation different than an orientation of the receive coil.

10. A magnetoelastic sensor comprising a plurality of magnetoelastic tags as defined in claim 1.

11. A magnetoelastic sensor as defined in claim 10, wherein each one of the magnetoelastic tags includes an individual resonator attached to an individual frame.

12. A magnetoelastic sensor as defined in claim 10, wherein the resonators of the plurality of magnetoelastic tags are arranged in an array.

13. A magnetoelastic sensor as defined in claim 10, wherein at least one of the resonators of the plurality of magnetoelastic tags has an orientation different from another one of the resonators of the plurality of magnetoelastic tags.

14. A magnetoelastic sensor as defined in claim 10, wherein at least one of the resonators of the plurality of magnetoelastic tags is stacked with at least one other resonator of the plurality of magnetoelastic tags.

15. A magnetoelastic sensor as defined in claim 10, wherein each resonator of the plurality of magnetoelastic tags has an individual characteristic electromagnetic response to an applied magnetic field, and the plurality of magnetoelastic tags has an electromagnetic response to the same applied magnetic field that is equal to or greater than a sum of the individual electromagnetic responses.

16. A magnetoelastic sensor as defined in claim 10, wherein at least one resonator of the plurality of magnetoelastic tags has one or both of the following different from another resonator of the plurality of magnetoelastic tags: a resonant frequency and a size.

17. A magnetoelastic sensor as defined in claim 10, wherein the resonator of each one of the magnetoelastic tags is suspended within the frame of the corresponding one of the magnetoelastic tags.

18. A magnetoelastic sensor as defined in claim 10, wherein the resonator and frame of each one of the magnetoelastic tags are monolithic and comprise the same magnetoelastic layer.

19. A magnetoelastic tag as defined in claim 1, wherein the resonator is suspended from the frame only along the outer perimeter of the resonator.

20. A magnetoelastic tag as defined in claim 1, wherein each coupling is located along one of the axes of symmetry.

* * * * *